United States Patent
Goodman

(10) Patent No.: US 7,219,242 B2
(45) Date of Patent: May 15, 2007

(54) DIRECT PLANE ACCESS POWER DELIVERY

(75) Inventor: Martin D. Goodman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 450 days.

(21) Appl. No.: 10/404,185

(22) Filed: Mar. 31, 2003

(65) Prior Publication Data

US 2004/0192076 A1     Sep. 30, 2004

(51) Int. Cl.
*G06F 1/26*     (2006.01)
(52) U.S. Cl. .................. 713/320; 713/300; 439/55
(58) Field of Classification Search ........... 713/300, 713/320; 439/55
See application file for complete search history.

(56) References Cited

U.S. PATENT DOCUMENTS

| | | | | |
|---|---|---|---|---|
| 4,694,123 A | * | 9/1987 | Massey | 174/117 FF |
| 5,136,471 A | * | 8/1992 | Inasaka | 361/794 |
| 5,838,549 A | * | 11/1998 | Nagata et al. | 361/794 |
| 6,379,193 B1 | * | 4/2002 | Fujii et al. | 439/680 |
| 6,392,897 B1 | * | 5/2002 | Nakase et al. | 361/785 |
| 6,577,508 B1 | * | 6/2003 | Kwong et al. | 361/760 |
| 6,646,912 B2 | * | 11/2003 | Hurst et al. | 365/175 |
| 6,658,530 B1 | * | 12/2003 | Robertson et al. | 711/115 |
| 6,790,760 B1 | * | 9/2004 | Cohn et al. | 438/613 |

* cited by examiner

*Primary Examiner*—Chun Cao
*Assistant Examiner*—Vincent Tran
(74) *Attorney, Agent, or Firm*—Blakely, Sokoloff, Taylor & Zafman LLP

(57) ABSTRACT

According to one embodiment of the present invention, a method for low impedance power delivery is disclosed. The method includes: providing a module, the module having a plurality of layers including a top layer; removing the top layer of the module to expose a power delivery plane; and providing a plurality of signal contacts on the top layer of the module to communicate signals between the module and an external device.

17 Claims, 4 Drawing Sheets

DIRECT PLANE ACCESS POWER DELIVERY

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

FIELD OF THE INVENTION

The present invention generally relates to the field of power delivery. More particularly, an embodiment of the present invention provides methods and apparatus related to direct plane access power delivery.

BACKGROUND

As the demand on digital equipment increases, the need for highly reliable, low-power, and fast memory modules also increases. Since much of the data handled by a digital device passes through memory modules, the memory module' reliability, power consumption, and speed are of utmost importance in the efficient operation of digital systems.

The need for reliable and quick memory modules is especially apparent in portable devices. In particular, portable devices rely on battery power and require relatively lower power consumption rates compared with, for example, desktop systems. Also, since portable devices are used in different setting and are moved around, reliability is very important in their memory systems. Moreover, faster memory modules are of importance in portable devices since, for example, due to space considerations, fewer memory modules may be utilized in a portable device to implement various functions that may be performed by specialized memory modules utilized in a desktop system.

BRIEF DESCRIPTION OF THE DRAWINGS

The invention is illustrated by way of example and not limitation in the figures of the accompanying drawings, in which like references indicate similar or identical elements, and in which.

DETAILED DESCRIPTION

In the following detailed description of the present invention numerous specific details are set forth in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
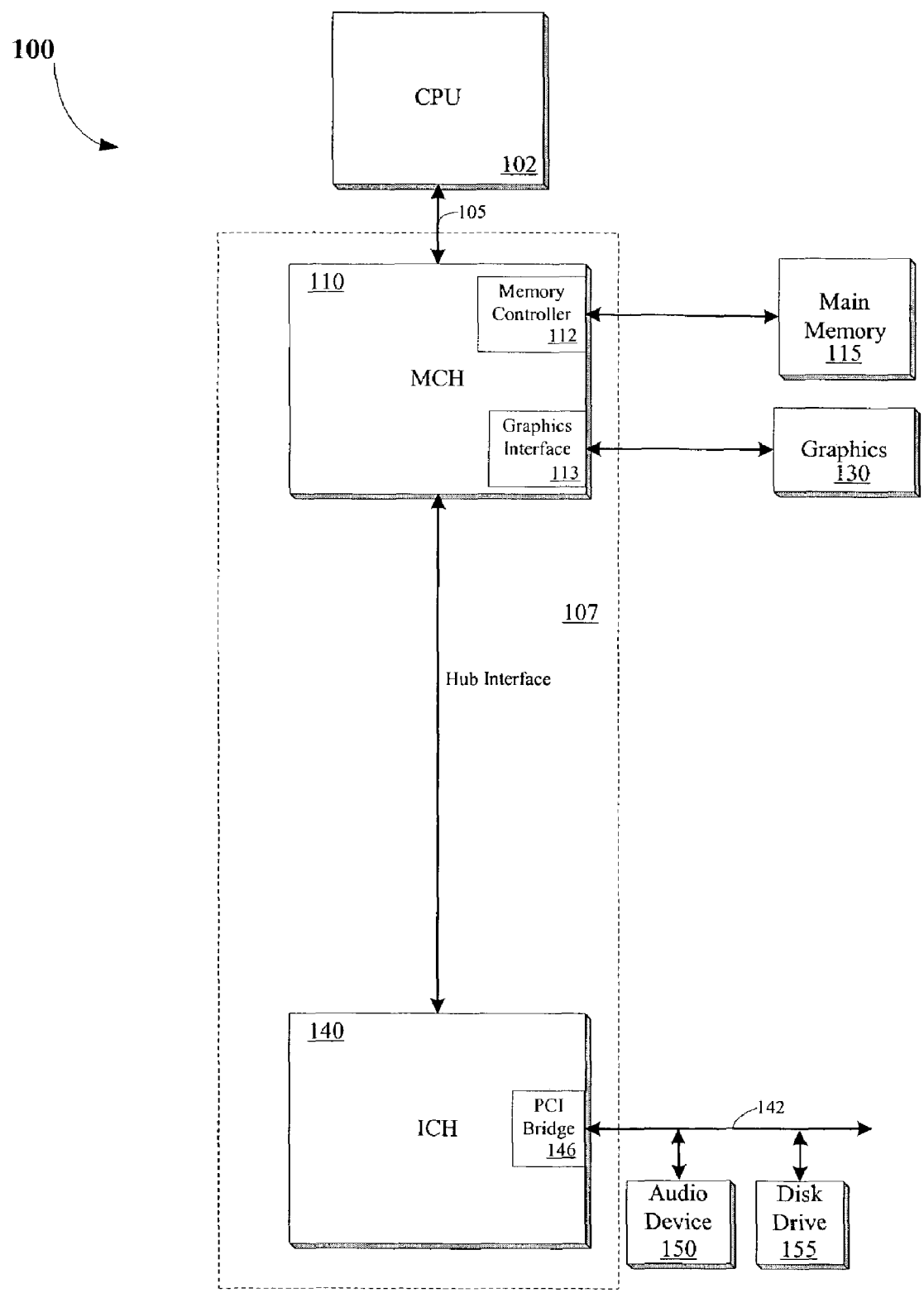
FIG. 1 illustrates an exemplary block diagram of a computer system 100 in accordance with an embodiment of the present invention.

FIG. 1 illustrates an exemplary block diagram of a computer system 100 in accordance with an embodiment of the present invention. The computer system 100 includes a central processing unit (CPU) 102 coupled to a bus 105. In one embodiment, the CPU 102 is a processor in the Pentium® family of processors including the Pentium II processor family, Pentium III processors, and Pentium IV processors available from Intel Corporation of Santa Clara, Calif. Alternatively, other CPUs may be used, such as Intel's XScale processor, Intel's Banias Processors, ARM processors available from ARM Ltd. of Cambridge, the United Kingdom, or OMAP processor (an enhanced ARM-based processor) available from Texas Instruments, Inc., of Dallas, Tex.

A chipset 107 is also coupled to the bus 105. The chipset 107 includes a memory control hub (MCH) 110. The MCH 110 may include a memory controller 112 that is coupled to a main system memory 115. Main system memory 115 stores data and sequences of instructions that are executed by the CPU 102 or any other device included in the system 100. In one embodiment, main system memory 115 includes dynamic random access memory (DRAM); however, main system memory 115 may be implemented using other memory types. Additional devices may also be coupled to the bus 105, such as multiple CPUs and/or multiple system memories.

The MCH 110 may also include a graphics interface 113 coupled to a graphics accelerator 130. In one embodiment, graphics interface 113 is coupled to graphics accelerator 130 via an accelerated graphics port (AGP) that operates according to an AGP Specification Revision 2.0 interface developed by Intel Corporation of Santa Clara, Calif. In an embodiment of the present invention, a flat panel display may be coupled to the graphics interface 113 through, for example, a signal converter that translates a digital representation of an image stored in a storage device such as video memory or system memory into display signals that are interpreted and displayed by the flat-panel screen. It is envisioned that the display signals produced by the display device may pass through various control devices before being interpreted by and subsequently displayed on the flat-panel display monitor.

In addition, the hub interface couples the MCH 110 to an input/output control hub (ICH) 140 via a hub interface. The ICH 140 provides an interface to input/output (I/O) devices within the computer system 100. The ICH 140 may be coupled to a Peripheral Component Interconnect (PCI) bus adhering to a Specification Revision 2.1 bus developed by the PCI Special Interest Group of Portland, Oregon. Thus, the ICH 140 includes a PCI bridge 146 that provides an interface to a PCI bus 142. The PCI bridge 146 provides a data path between the CPU 102 and peripheral devices.

The PCI bus 142 includes an audio device 150 and a disk drive 155. However, one of ordinary skill in the art will appreciate that other devices may be coupled to the PCI bus 142. In addition, one of ordinary skill in the art will recognize that the CPU 102 and MCH 110 could be combined to form a single chip. Furthermore, graphics accelerator 130 may be included within MCH 110 in other embodiments.

In addition, other peripherals may also be coupled to the ICH 140 in various embodiments. For example, such peripherals may include integrated drive electronics (IDE) or small computer system interface (SCSI) hard drive(s), universal serial bus (USB) port(s), a keyboard, a mouse, parallel port(s), serial port(s), floppy disk drive(s), digital output support (e.g., digital video interface (DVI)), and the like. Moreover, the computer system 100 is envisioned to receive electrical power from one or more of the following sources for its operation: a battery, alternating current (AC) outlet (e.g., through a transformer and/or adaptor), automotive power supplies, airplane power supplies, and the like.

Figure 2:
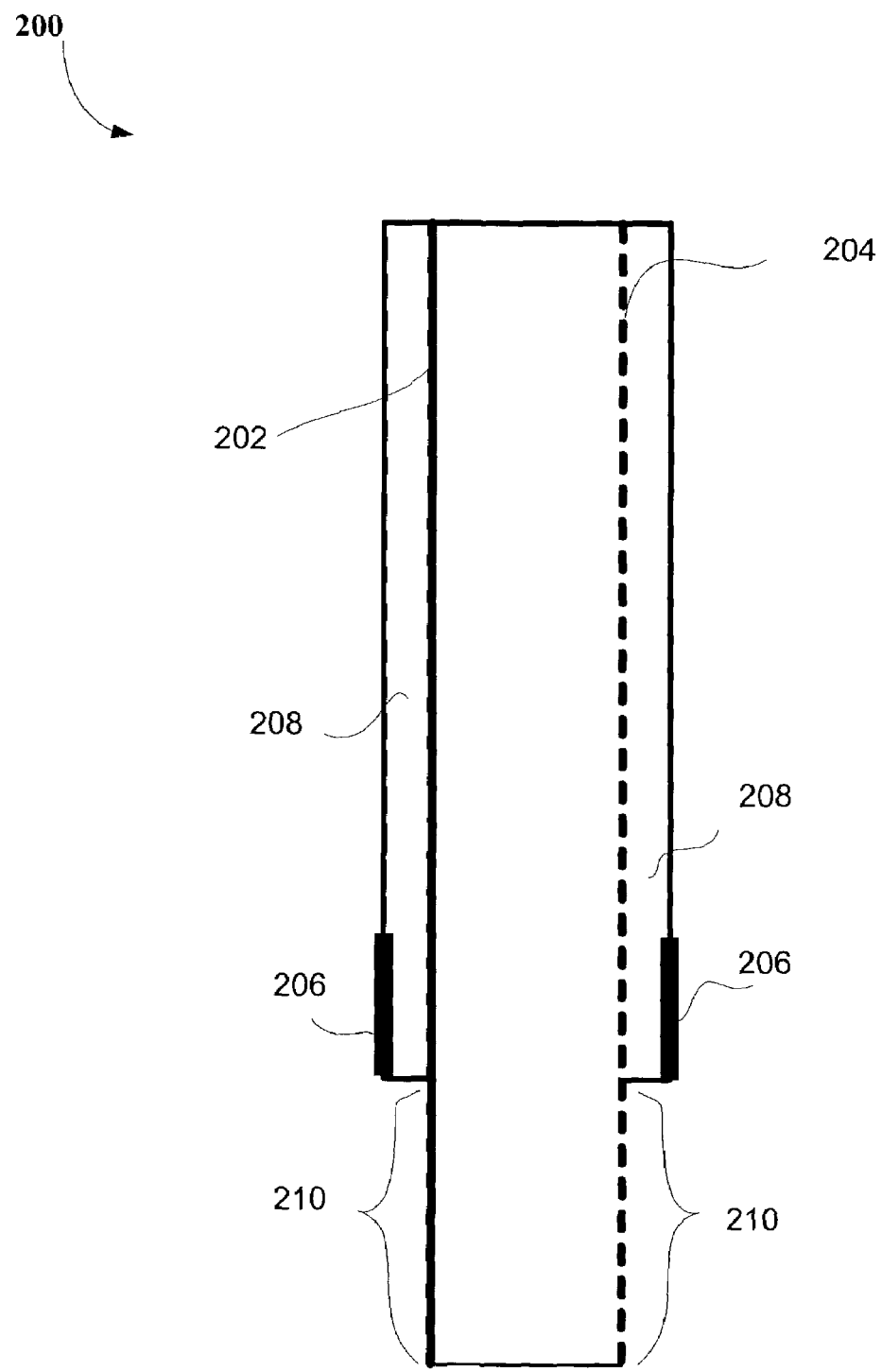
FIG. 2 illustrates an exemplary cross-sectional view of a memory module 200 in accordance with an embodiment of the present invention.

FIG. 2 illustrates an exemplary cross-sectional view of a memory module 200 in accordance with an embodiment of the present invention. In an embodiment of the present invention, the memory module 200 is a dual in-line memory module (DIMM) such as a small outline DIMM (SODIMM). The memory module 200 includes a power plane 202, a ground plane 204, and one or more signal pins 206.

In an embodiment of the present invention, the signal pins are provided in a top layer of the memory module 200 and/or are embedded therein. Moreover, the signal contacts may connect to signal traces (e.g., inside the memory module 200) through one or more vias. The elimination of one or more vias is envisioned to improve the parasitic characteristics of the power connections in accordance with an embodiment of the present invention.

In one embodiment of the present invention, the memory module 200 may be a printed circuit board (PCB) constructed with material such as resin compounds and the like. The pins 206 may be constructed with electrically conductive material such as copper, aluminum, and the like.

In one embodiment of the present invention, the memory module 200 is constructed of a plurality of layers, which may be pressed together under temperature to for example cure the memory module. In another embodiment of the present invention, the memory module 200 may be constructed of laminated fiberglass (e.g., FR4). In a further embodiment of the present invention, one or more of the top layers 208 of the memory module 200 may be removed to expose the power plane 202 and/or the ground plane 204, for example in regions 210.

Figure 3:
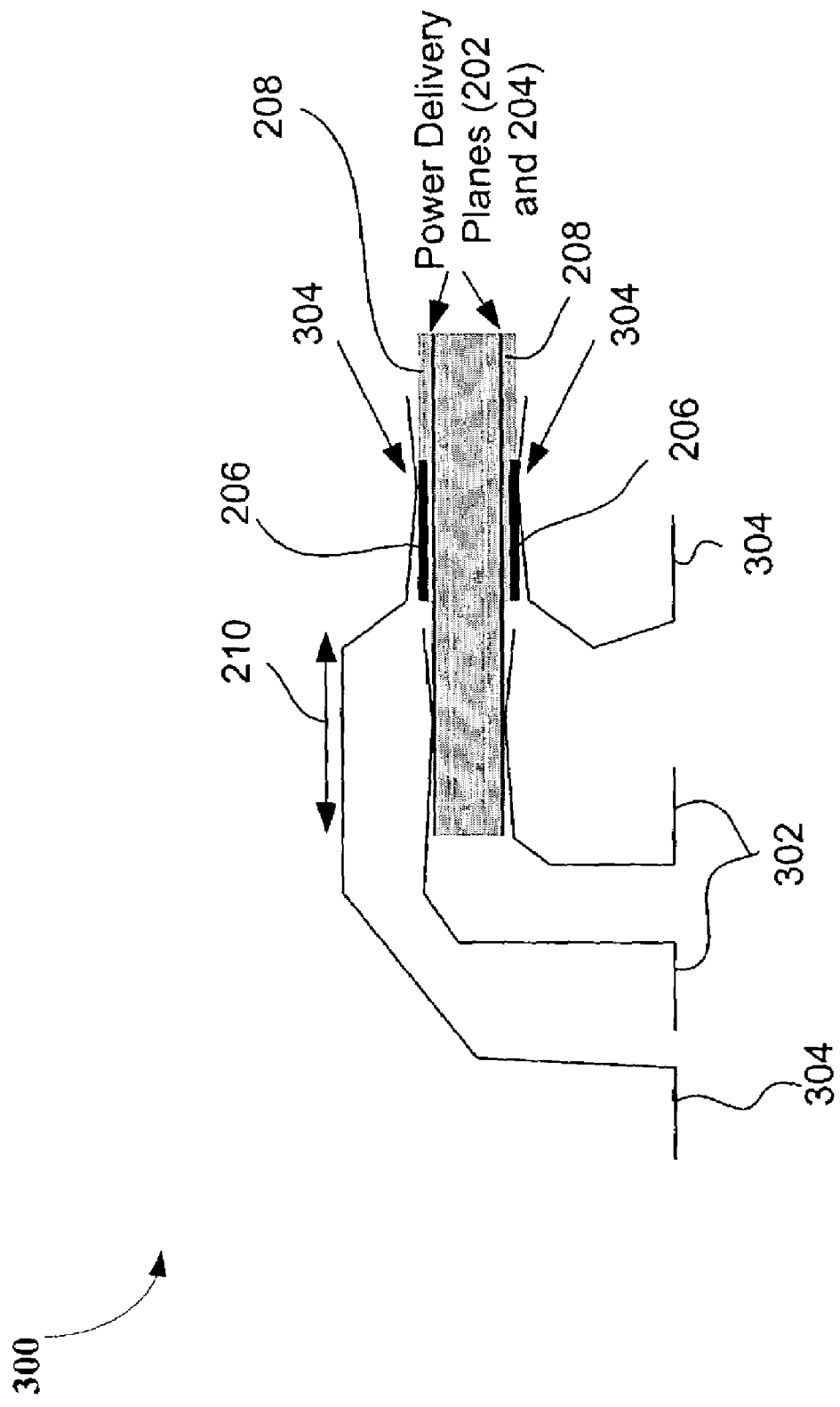
FIG. 3 illustrates an exemplary cross-sectional side view of a memory module 300 in accordance with an embodiment of the present invention.

FIG. 3 illustrates an exemplary cross-sectional side view of a memory module 300 in accordance with an embodiment of the present invention.

In one embodiment of the present invention, the memory module 300 may be the same or similar to the memory module 200 of FIG. 2. The memory module 300 includes the power and ground planes (202 and 204) and the top layers 208. The memory module 300 also illustrates power connectors 302, which in an embodiment of the present invention make electrical contact with the power and ground planes (202 and 204) in the regions 210.

In one embodiment of the present invention, the regions 210 are exposed by removing about 4 mils (or 0.1 mm) of the top layer of the memory module 200. The memory module 300 additionally includes signal contacts 304 which in an embodiment of the present invention make electrical contact with the signal pins 206.

Figure 4:
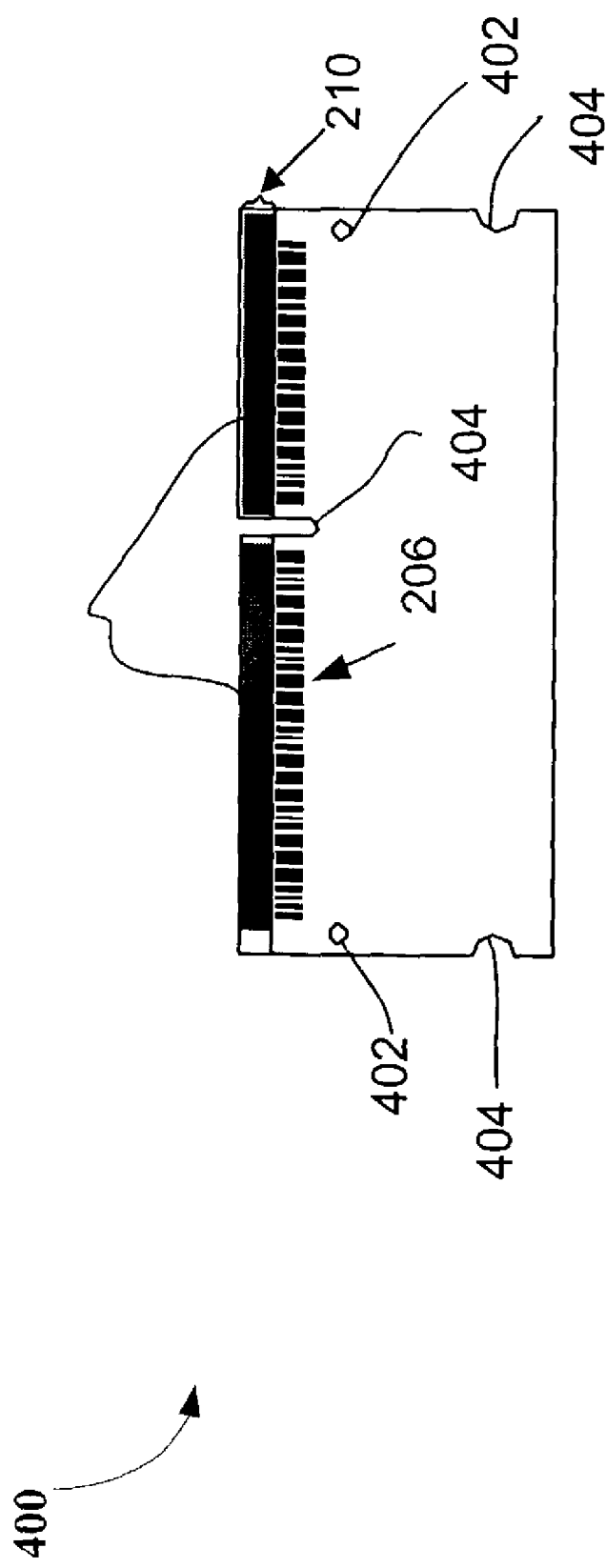
FIG. 4 illustrates an exemplary side view of a memory module 400 in accordance with an embodiment of the present invention.

FIG. 4 illustrates an exemplary side view of a memory module 400 in accordance with an embodiment of the present invention. In one embodiment of the present invention, the memory module 400 may be the same or similar to the memory module 200 and 300 of FIGS. 2 and 3, respectively. The memory module 400 includes the power and ground planes (202 and 204), the regions 210, and the signal contacts 206. The memory module 400 also includes one or more locking holes 402 and locking guides 404. The locking holes 402 and locking guides 404 may be utilized to install the memory module in a computer system such as that discussed with respect to FIG. 1.

In one embodiment of the present invention, the inner PCB layer (e.g., in the regions 210) is exposed to provide a relatively clean power connection by directly contacting to the power and ground planes (202 and 204, respectively). In part, such an embodiment avoids the need for vias to reach the power and ground connection. Furthermore, the planes may have fewer anti-pads or holes in them near the card edge due to the fact that the power vias need not be perforating the ground plane and the ground vias need not be perforating the power plane.

In a further embodiment of the present invention, exposing the inner PCB provides a low impedance path for power delivery without consuming signal pins. This is particularly advantageous for relatively narrower cards where the minimum connector pitch does not allow enough pins for all the signals and adequate power delivery. In yet another embodiment of the present invention, exposing the inner PCB provides power delivery to high density, high speed memory cards for the mobile platform.

Whereas many alterations and modifications of the present invention will no doubt become apparent to a person of ordinary skill in the art after having read the foregoing description, it is to be understood that any particular embodiment shown and described by way of illustration is in no way intended to be considered limiting. For example, the techniques discussed with reference to various embodiments herein may be applied to any compact, high-performance digital add in card with relatively demanding power requirements, such as a graphics device. Therefore, references to details of various embodiments are not intended to limit the scope of the claims which in themselves recite only those features regarded as essential to the invention.

What is claimed is:

1. A method of providing a connector for a removable module comprising:
   constructing a module, the module having a plurality of layers including a top layer and an edge along one side;
   removing the top layer of the module along the edge of the module to expose a power delivery plane, the exposed region to form a first contact region for a connector along the edge of the module, wherein the first contact region is adjacent to an edge of the memory module; and
   embedding a plurality of signal contacts on the top layer of the module to communicate signals between the module and an external device, wherein the signal contacts are arranged in a line along the exposed region.

2. The method of claim 1 wherein the power delivery plane is selected from a group comprising a power plane and a ground plane.

3. The method of claim 1 wherein the signal contacts are embedded in the top layer of the memory module and connect to signal traces.

4. The method of claim 1 wherein the low impedance path provides power delivery without consuming signal pins.

5. The method of claim 1 wherein the low impedance path provides relatively cleaner power delivery.

6. The method of claim 1 wherein the module is selected from a group comprising a memory module and a graphics card.

7. The method of claim 1 wherein the external device is a central processing unit (CPU).

8. A computer system comprising:
   a central processing unit (CPU);
   a bus, coupled to the CPU; and
   a memory module removably coupled to the CPU through the bus, the memory module having a connector along an edge of the module, the connector including plurality of signal contacts on a top layer and one or more exposed regions of a power delivery plane below the top layer in which the top layer has been removed, the exposed regions extending along the edge of the module adjacent to the edge of the module, wherein the signal contacts are arranged in a line along the exposed region.

9. The computer system of claim 8 wherein the power delivery plane is selected from a group comprising a power plane and a ground plane.

10. The computer system of claim 8 wherein the signal contacts are embedded in a top layer of the memory module and connect to signal traces.

11. The computer system of claim 8 wherein the exposed regions provides a low impedance path and the low impedance path provides power delivery without consuming signal pins.

12. A removable module for electronic devices comprising:
   a circuit board including a top layer and a power delivery plane beneath the top layer; and
   a connector including signal contacts on the top layer to communicate with an external device, and an exposed region of the power delivery plane to receive external power, wherein the signal contacts are arranged in a line along the exposed region, wherein the exposed region is on an outer edge of the connector and the signal contacts are in a line along and near the exposed region opposite the outer edge.

13. The module of claim 12 further comprising a plurality of memory modules coupled to the circuit board, the memory modules communicating through the signal contacts and receiving power through the exposed region of the power plane.

14. The module of claim 13, wherein the signal connections are coupled to the memory modules through vias and the exposed region of the power delivery plane is coupled to the memory modules directly through the power delivery plane.

15. The module of claim 12, wherein the power delivery plane comprises a power plane.

16. The module of claim 12, wherein the exposed region is formed by removing at least the top layer of the circuit board.

17. The module of claim 12, wherein the exposed region is elongated and extends along the outer edge and wherein the signal contacts are arranged in a line along the exposed region.

* * * * *

UNITED STATES PATENT AND TRADEMARK OFFICE
CERTIFICATE OF CORRECTION

PATENT NO. : 7,219,242 B2 Page 1 of 1
APPLICATION NO. : 10/404185
DATED : May 15, 2007
INVENTOR(S) : Goodman It is certified that error appears in the above-identified patent and that said Letters Patent is hereby corrected as shown below:

In column 1, at line 25, delete "ule" and insert --ules'--.

Signed and Sealed this

Eighth Day of April, 2008

JON W. DUDAS
*Director of the United States Patent and Trademark Office*